US010481176B2

(12) United States Patent
McGrath, Jr.

(10) Patent No.: US 10,481,176 B2
(45) Date of Patent: *Nov. 19, 2019

(54) HIGH BANDWIDTH DIFFERENTIAL LEAD WITH DEVICE CONNECTION

(71) Applicant: TEKTRONIX, INC., Beaverton, OR (US)

(72) Inventor: James H. McGrath, Jr., Aloha, OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 15/281,889

(22) Filed: Sep. 30, 2016

(65) Prior Publication Data
US 2017/0016935 A1 Jan. 19, 2017

Related U.S. Application Data

(63) Continuation of application No. 13/724,344, filed on Dec. 21, 2012, now Pat. No. 9,482,695.

(51) Int. Cl.
G01R 1/067 (2006.01)
G01R 31/28 (2006.01)
H01B 1/00 (2006.01)
G01R 1/04 (2006.01)

(52) U.S. Cl.
CPC ......... *G01R 1/06722* (2013.01); *G01R 1/045* (2013.01); *G01R 1/067* (2013.01); *G01R 1/06772* (2013.01); *G01R 31/2889* (2013.01); *H01B 1/00* (2013.01); *G01R 1/0416* (2013.01)

(58) Field of Classification Search
None
See application file for complete search history.

(56) References Cited

U.S. PATENT DOCUMENTS

| 4,029,375 | A | * | 6/1977 | Gabrielian | H01R 12/714 439/66 |
| 4,214,201 | A | * | 7/1980 | Kern | G01R 1/073 324/72.5 |
| 5,004,977 | A | | 4/1991 | Kazama | |
| 5,101,553 | A | | 4/1992 | Carey et al. | |
| 6,043,666 | A | * | 3/2000 | Kazama | G01R 1/06722 324/755.05 |
| 6,124,716 | A | | 9/2000 | Kanamori | |
| 6,204,680 | B1 | | 3/2001 | Swart | |

(Continued)

OTHER PUBLICATIONS

Extended European Search Report dated Mar. 7, 2017, for European Patent Application No. 13198323.1 (10 pages).

*Primary Examiner* — Paresh H Patel

(74) *Attorney, Agent, or Firm* — Miller Nash Graham & Dunn; Andrew J. Harrington

(57) ABSTRACT

A signal lead structured to be attached to an electrical device that comprises a signal pad, a spring housing, a spring, and a flexible conduit. The spring is carried in the spring housing, and a portion of the spring extends beyond a surface of the spring housing when the spring is unsprung. The spring is structured to touch the electrical device and carry an electrical signal between the electrical device and the signal pad when the signal lead is attached to the electrical device. The flexible conduit is coupled to the signal pad at an end of the flexible electrical conduit and extends away from the spring housing.

20 Claims, 5 Drawing Sheets

(56) References Cited

U.S. PATENT DOCUMENTS

| | | | | |
|---|---|---|---|---|
| 6,215,656 | B1* | 4/2001 | O'Neal | G06F 1/183 |
| | | | | 361/679.02 |
| 6,400,172 | B1 | 6/2002 | Akram et al. | |
| 6,428,341 | B2 | 8/2002 | Kinezuka et al. | |
| 6,666,690 | B2* | 12/2003 | Ishizuka | H01R 13/2421 |
| | | | | 439/591 |
| 7,126,062 | B1 | 10/2006 | Vinther et al. | |
| 7,154,286 | B1 | 12/2006 | Marx et al. | |
| 9,482,695 | B2* | 11/2016 | McGrath, Jr. | G01R 1/06772 |
| 2004/0201388 | A1 | 10/2004 | Barr | |
| 2005/0225336 | A1 | 10/2005 | Kojima | |
| 2008/0061803 | A1* | 3/2008 | Lane | G01R 27/205 |
| | | | | 324/715 |
| 2010/0073018 | A1 | 3/2010 | Ruppelt | |
| 2010/0271043 | A1 | 10/2010 | Katoh | |

\* cited by examiner

HIGH BANDWIDTH DIFFERENTIAL LEAD WITH DEVICE CONNECTION

CROSS REFERENCE TO RELATED APPLICATION

This application is a continuation of, and claims priority to, U.S. patent application Ser. No. 13/724,344, filed on Dec. 21, 2012, which is incorporated here by this reference.

FIELD OF THE INVENTION

This disclosure is directed to lead assemblies, and, more particularly, to devices that couple test equipment to devices to be tested through such lead assemblies.

BACKGROUND

Electrical devices are often tested, especially during development, production, or when they are not working properly. Test equipment provides information about the operation of the devices. Test equipment may include meters, probes, logic analyzers, and scopes such as oscilloscopes, for example.

It is sometimes difficult to accurately measure high frequency signals generated by a device because of, among other reasons, the difficulty in reliably connecting or coupling the device under test to the measuring device. For the best results, the devices should be solidly electrically connected to the test device. For example, a preferred method for measuring test signals having frequencies between 6-10 GHz is to first attach a small solder-in lead to various testing points in the circuit. Then, the lead may be coupled to a probe of a high-frequency testing device and the signals of the device are measured. In practice, the probe may be manually coupled to a number of separate soldered-in leads so that the signals at the testing points may be measured.

Even though soldering such connections is the best currently available method, it is not without problems. Installation of such devices by soldering the typically small leads is problematic, and can lead to damage to either the lead, the device, or both. Damaging either may be costly, either in equipment or in time lost to fix the damage. Further, solder-in leads tend to be small and are damaged easily, and it is easy to break the fine leads that are typically coupled to coax cable connectors. Costs are another issue, both in device and labor costs, as the leads are expensive and take time to install properly.

Embodiments of the invention address these and other limitations of the prior art.

SUMMARY OF THE INVENTION

Aspects of the invention include a high bandwidth solderless lead mountable to an electrical device having land patterns. The lead includes an attachment mechanism to attach the lead to the device, a microspring housing, and at least one microspring carried in the housing. A portion of the microspring extends beyond the microspring housing to electrically couple to one of the land patterns of the electrical device. In some embodiments there may be multiple microsprings coupling different signals from the device to the solder-less lead. The signals may include ground signals. The lead may be attached to a flexible conduit that is readily attachable to a test device, such as through a socket.

Other aspects include a combination of a solder-less lead having at least one microspring carried in a housing for coupling to an electrical device in which the lead is removably or temporarily coupled to a connector. The connector further includes another microspring carried in another housing. The solder-less lead may be permanently attached to the electrical device, while the connector may be temporarily connected to a first lead, and then connected to a second lead to measure a second set of signals.

DETAILED DESCRIPTION

Figure 1:
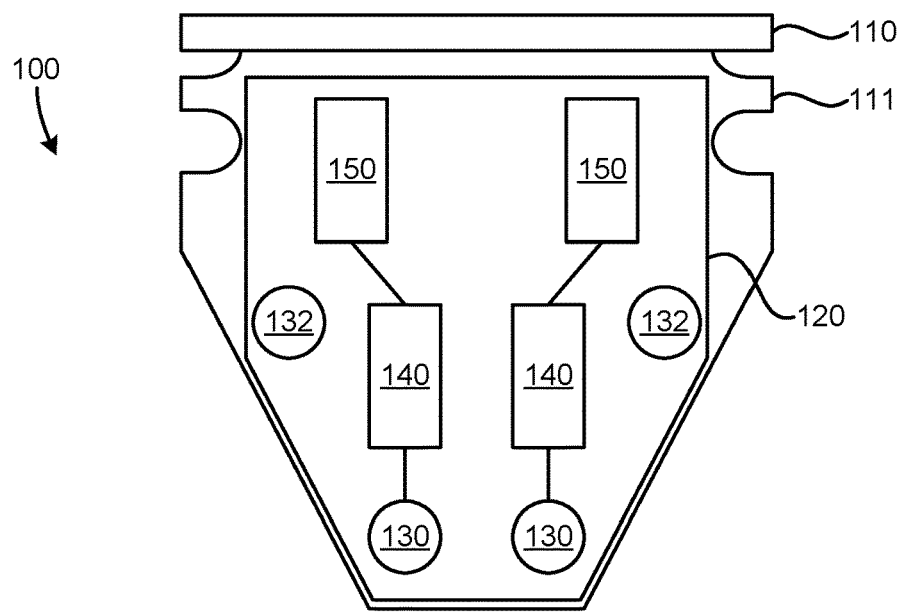
FIG. 1 is a top view of a head of a lead assembly for attaching to a device being tested according to embodiments of the invention.
Figure 2:
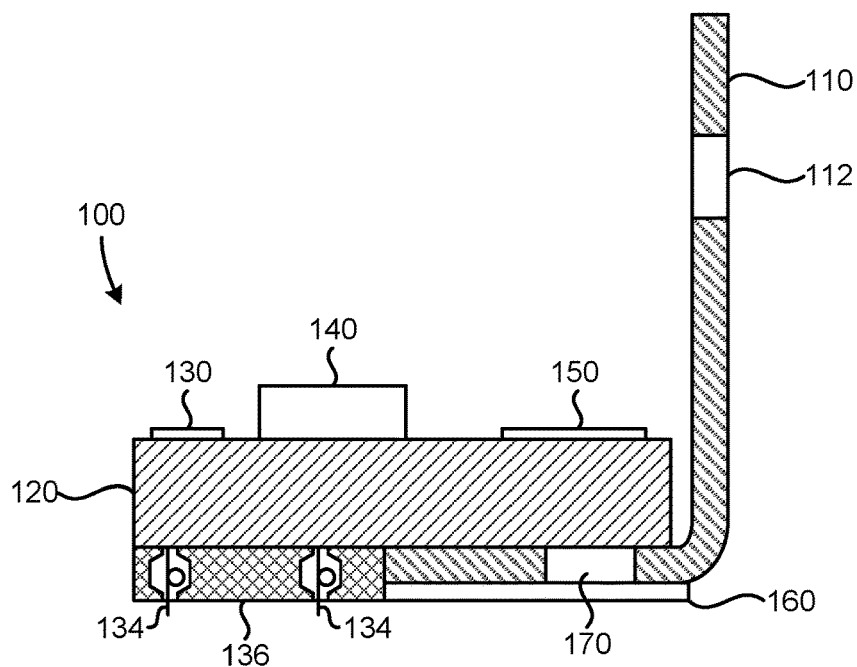
FIG. 2 is a is a side view of the lead assembly of FIG. 1 attached to a connection bracket according to embodiments of the invention.

Embodiments of the invention are now described beginning with reference to FIGS. 1 and 2. FIG. 1 is a top view of a head of a lead assembly for attaching to a device being tested according to embodiments of the invention, and FIG. 2 is a side view of the same device.

A head assembly 100, generally, is structured to physically attach to a device under test (DUT) (not illustrated). Such devices may include those devices that have high-speed RF signals on the board. In many embodiments the device will have an exposed printed circuit (PC) board that terminates in test points or includes particular land patterns. Land patterns are areas for electrical connection, such as for connecting a surface mounted Integrated Circuit (IC) to a particular device. Land patterns may also be used to couple to a testing device, or to a probe or other lead coupled to the testing device. Land patterns are oftentimes used as soldering points to connect the DUT to a soldered lead assembly. Land patterns could be, for example, flat spots of metal or solder-covered metal, or could be raised bumps on a PC board of the DUT. Bumps could be bumps of a Ball Grid Array (BGA), for instance. Of course, the examples described herein are merely examples, and embodiments of the invention may be used in various and multiple ways without deviating from the inventive scope.

The test lead 100 of FIG. 1 includes a support bracket 110, which is more apparent in FIG. 2. The support bracket 110 may be formed of metal or other supporting material.

Coupled to the support bracket 110 is a support board, such as a PC board 120. The PC board 120 may be soldered to the bracket 110 through solder tabs 111 or otherwise attached to the support bracket 110. The PC board 120 has components mounted thereon. For instance, a set of resistors 140, or other components, may be mounted between a set of signal pads 130 and a set of probing signal pads 150. A set of ground pads 132 may also be included. As described below, the set of signal pads 130 may be coupled to the set of land patterns of the DUT, and a set of probing signal pads 150 provides an area for measurement by a probe of a measurement device. The probing signal pads 150 are typically larger than the land patterns on the DUT, which makes it easier to couple to the test probe. The probing signal pads 150 may also be referred to as differential pads because they are typically placed in pairs, and the pair receives differential signals, one on each pad of the pair.

The ground pads 132 may likewise be coupled to signal grounds of the DUT, as described below.

As shown in FIG. 2, springs 134 may be connected to an under-side of the signal pads 130 and ground pads 132 through a via in the PC board 120. The springs 134 make an electrical connection between the signal pads 130, ground pads 132 and their respective land patterns on the DUT. The springs 134 may be metal having a relatively low resistance. The springs 134 may be shaped as microsprings, and capable of carrying high bandwidth signals from the land patterns of the DUT to the signal pads 130 and ground pads 132, respectively.

The springs 134 may be supported by an insulated spring housing 136. The spring housing 136 maybe be a plastic of sufficient strength and stiffness to properly support the springs 134. The spring housing 136 may be made of thermoplastic polyetherimide such as Ultem plastic available from SABIC, or from any other suitable material.

The springs 134 may be spaced to exactly match the spacing of the land patterns of the DUT. In some embodiments, multiple test leads 100 may be available, each having different spacing between the springs 134. In those embodiments, a test engineer selects the proper test lead 100 having the desired spacing. In other embodiments, device manufacturers may develop one or more standard spacings that are based on the widths between the springs 134.

The test lead 100 also includes an attachment mechanism 160, such as adhesive foam, epoxy, or a clamp, so that the test lead 100 may be attached to the DUT. In some embodiments the test lead 100 may be mounted on the DUT permanently.

In practice, to mount the test lead 100 to the DUT, the adhesive foam 160 is exposed by removing a protective covering. In some embodiments the same or another protective covering also covers and protects the springs 134, and removing the covering or coverings exposes a bottom portion of the springs. After uncovering the adhesive foam 160, the test lead 100 is lowered toward the DUT so that the exposed springs 134 touch the land patterns in a mating fashion. Then, the test lead 100 is pressed into place, making a secure connection to the DUT with the adhesive foam 160, and simultaneously making a secure electrical connection between the land patterns of the DUT and the springs 134. As described above, the springs 134 make a secure electrical connection between the land patterns and the under-side of the signal pads 130 and ground pads 132 of the test lead 100. Further, a top side of the signal pads 130 and ground pads 132 may also include surfaces so that wires or other electrical connections may be made to other portions of the DUT. Or, in some embodiments, the test lead 100 may be attached to the DUT by the adhesive foam 160, or other methods, near the desired land patterns, and the land patterns may be connected to the top of the signal pads 130 and ground pads 132 with soldered wires, and not necessarily through the springs 134.

Figure 3:
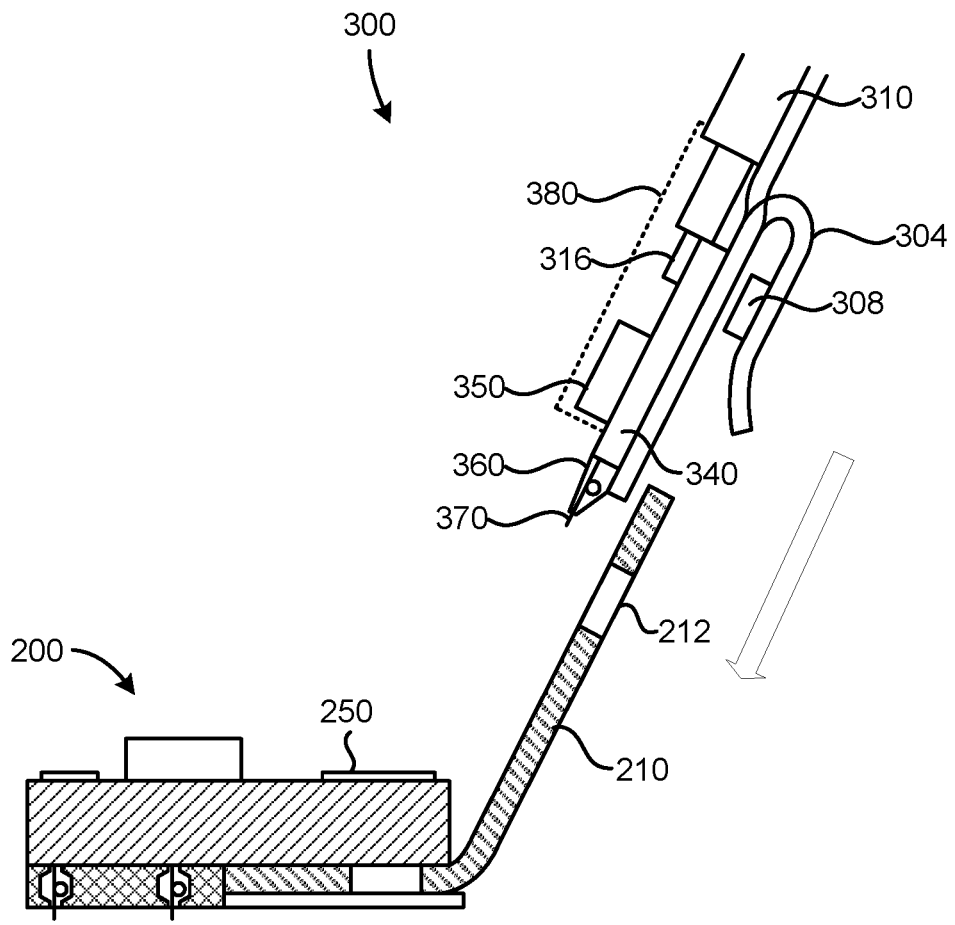
FIG. 3 is a side view of an example lead assembly as it is being coupled to a head end of a cable assembly according to embodiments of the invention.
Figure 4:
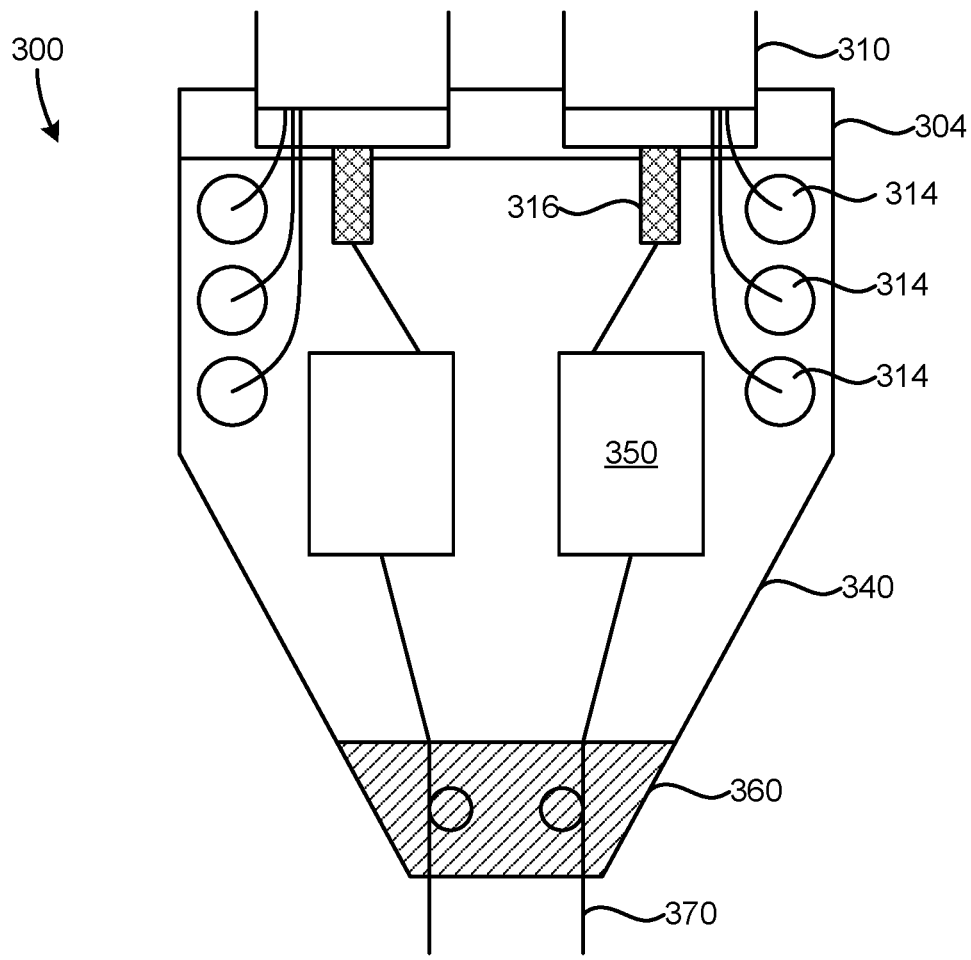
FIG. 4 is a top view of the head end of the cable assembly according to embodiments of the invention.

With reference to FIGS. 3 and 4, described is a connector assembly 300 that may be matingly and removably coupled to the test lead 200, which may be an example of the lead 100 of FIG. 1. In other words, after the test lead 200 has been attached to the DUT, using the methods described above, a connector assembly 300 may be temporarily attached to test lead 200 and be used to electrically connect it to the measurement device through a cable, such as a pair of coaxial cables 310, so that measurements of the DUT may be made. In this way, a single probe may be able to easily attach to multiple test leads 200 mounted on a DUT in a serial manner, i.e., first testing a first test lead, then removing it from the first test lead and attaching it to another, etc. After the testing is complete, the test lead 200 may be left attached to the DUT, while the connector assembly 300 may be used to test other devices.

The test lead 200 of FIG. 3 differs from the test lead 100 of FIG. 1 by the position of a bracket 210. More specifically, the bracket 210 is bent away from the main body of the test lead 200. As described above, the bracket 210 may be made from a yieldable material, such as a soft metal, that may be relatively easily moved, such as by manual pressure, but remains in place once moved. One benefit to having a positionable bracket 210 is that it allows the connector assembly 300 to be attached to the test lead 200 even though there may be an interfering structure that would otherwise hinder attaching the connector assembly 300. Because it is unknown in advance what hindrances there may be near a test site of the DUT, having a bracket 210 that is positionable may allow the test lead 200 to be used with more test sites of a DUT than if the bracket were not positionable.

The connector assembly of FIGS. 3 and 4 includes a pair of springs 370 that are used to electrically connect to the probing signal pads 250 of the lead 200. Recall from above that the probing signal pads 250 are coupled through the lead 200 to land patterns of the DUT. The pair of springs 370 then connect the probing signal pads 250 to a pair of coaxial cables 310, which conveys the signals from land patterns of the DUT to a probe of the measurement device (not illustrated) so that the DUT may be measured. Ground signals may be carried by the bracket 210, or may be coupled to ground pads 314 in another manner. The coaxial cables 310 may be skew matched for better signal integrity.

The springs 370 may be the same or similar to the springs 134 of FIG. 2, except the springs 370 are positioned to project from the connector assembly 300 directly opposite the coaxial cables 310. The springs 370 are held in a spring housing 360. The housing 360 maybe be a plastic of sufficient strength and stiffness to properly support the springs 370. Similar to the spring housing 136 described above, the spring housing 360 may be made of thermoplastic polyetherimide. The spring housing 360 may have a shape at one end to facilitate the springs 370 to contact the probing signal pads 250 no matter what position the bracket 210 is in. For example the spring housing 360 may have an angled shape as illustrated in FIG. 3, or the spring housing 360 may be rounded. Other shapes may function in another manner to produce an acceptable result. A substance or structure 380 may cover much of the connector 300 to provide strain relief of the connector 300.

A PC board 340 provides a physical support and electrical connections to signal processing circuits 350. The processing circuits 350 process the signals from the DUT before they are passed through the coaxial cables 310 to the measuring device.

With reference to FIG. 4, test signals from the DUT are passed from the springs 370, through the processing circuits 350, to a conductor 316 of the coaxial cable 310. Similarly, ground connections 314 are coupled to another conductor of the coaxial cable 310. The connector 300 of FIG. 4 is symmetric about the longitudinal axis, with a first signal being carried on one of the coaxial cables 310, and a second differential signal carried on the other, as is known in the art.

In other embodiments the connector 300 may only include a single signal path and convey only a single test signal.

With reference back to FIG. 3, to couple the connector 300 to the test lead 200, a user moves the connector toward the bracket 210 to mate with a spring latch 304 that includes a projection 308. When inserted, the projection 308 is received and captured in a receiver, such as a depression or hole 212 in the bracket 210 to create a secure physical connection between the connector 300 and the test lead 200. The secure physical connection also ensures that there is a secure electrical connection between the springs 370 and the probing signal pads 250.

Figure 5:
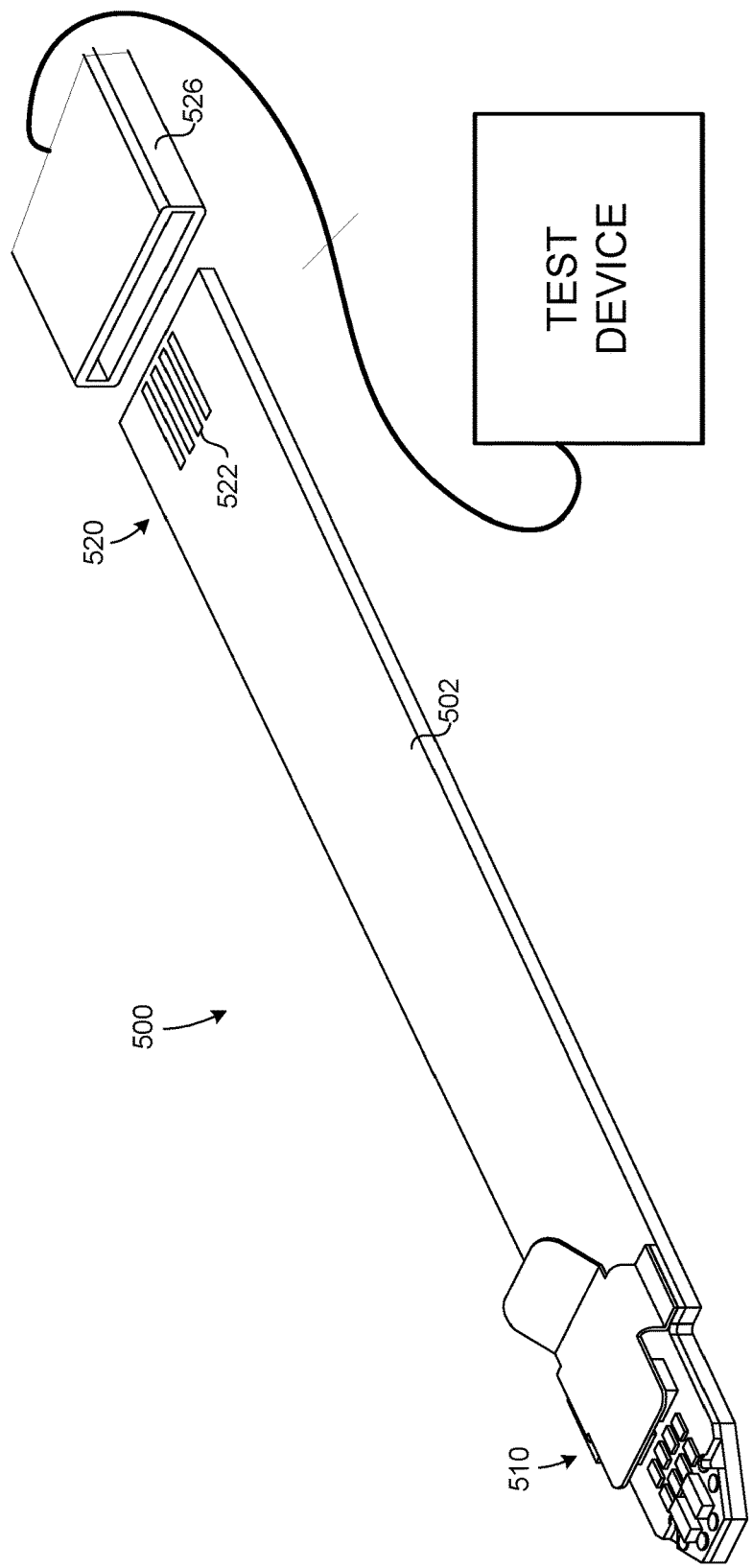
FIG. 5 is a perspective view of a lead assembly for attaching to a device according to other embodiments of the invention.

FIG. 5 illustrates another device to couple a measurement device with a DUT. In FIG. 5, a connector 500 includes a head end 510 and a tail end 520. The head end 510 attaches to the DUT in a similar fashion as the test leads 100, 200, described above, and is described in more detail below. A strap 502 carries electrical signals from the head end 510 to the tail end 520, ending in a set of terminals 522. The tail end 520 in this embodiment is structured to be inserted into a zero insertion force (ZIF) socket 526, where the terminals 522 make an electrical connection with terminals within the ZIF socket 526. In this embodiment, the test device, which is coupled to the ZIF socket 526, may be connected to various different connectors 500 simply by removing the tail end 520 from a first connector and inserting a tail end from another connector. In practice the connector 500 may be left attached to the DUT, even after testing is completed. Of course, the tail end 520 may differ depending on implementation details.

Figure 6:
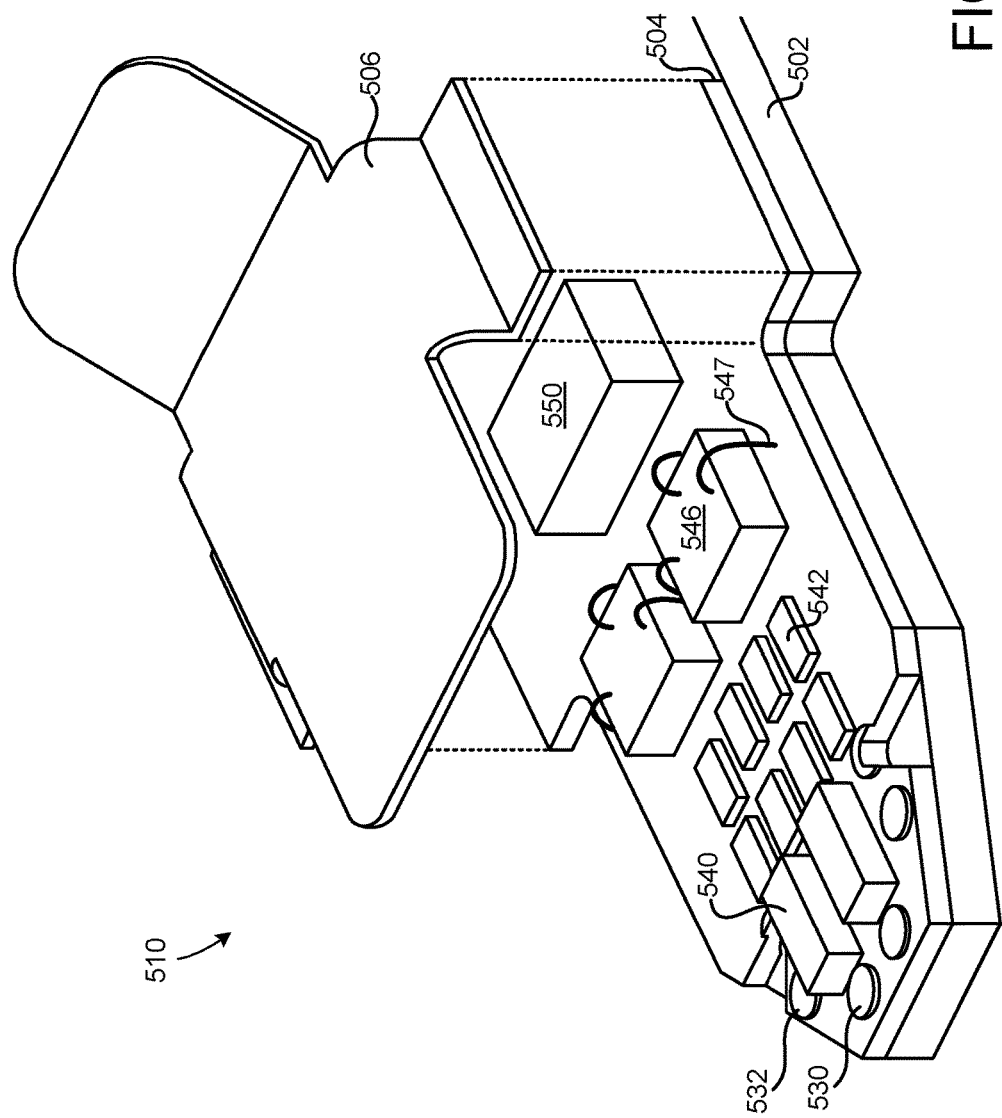
FIG. 6 is a perspective view of a head of the lead assembly of FIG. 5 according to embodiments of the invention.

FIG. 6 illustrates more details of the head end 510 of the connector 500. The head end 510 of the connector 500 includes many of the same components as described in the test lead 200 and connector 300 described above, except the components are combined into a single unit.

More specifically, the connector 500 includes a strap 502, which may be a flexible plastic that has conductive paths running through it. Signal pads 530 and ground pads 532 operate like their counterparts 130, 132 described above with reference to FIG. 1. Further, the connector 500 may be connected to the DUT using microsprings (not pictured) below the signal pads 530, 532 and the other attachment mechanism, as described above.

A substrate, such as a PC board 504 provides physical support and electrical connections for the components 540, 542, mounted thereon. These components may vary depending on the particular signals being measured, but could include, for instance, resistors, capacitors, etc. An integrated circuit 546 modifies the signal before being measured, similar to the processing circuits 350 described above. Further, the connector 500 may include an identification device 550, such as a memory device like an EPROM or EEPROM that may identify the particular connector 500 to the test device. Optionally, a tab 506, which may be made of plastic or other material, may be attached to the connector 500. The tab 506 allows the connector 500 to be more easily handled when attaching or, less likely, removing, the connector to the DUT. The tab 506 also provides physical protection for any delicate features that may be mounted on the connector 500, such as the small connection wires 547.

It will be appreciated from the forgoing discussion that the present invention represents a significant advance in the field of test and measurement. Although specific embodiments of the invention have been illustrated and described for purposes of illustration, it will be understood that various modifications may be made without departing from the spirit and scope of the invention. Accordingly, the invention should not be limited except as by the appended claims.

The invention claimed is:

1. A signal lead structured to be attached to an electrical device, the signal lead comprising:
    a signal pad;
    a first spring housing, the first spring housing structured to touch the electrical device when the signal lead is attached to the electrical device;
    a printed circuit board coupled to the first spring housing, the signal pad being disposed on the printed circuit board;
    a first spring carried in the first spring housing, the first spring being uncompressed and having a first end extending beyond a surface of the first spring housing when the signal lead is not attached to the electrical device, and the first spring being compressed and having the first end substantially even with the surface of the first spring housing when the signal lead is attached to the electrical device, and the first spring structured to touch the electrical device and carry an electrical signal between the electrical device and the signal pad when the signal lead is attached to the electrical device;
    a flexible electrical conduit coupled to the printed circuit board at a first end of the flexible electrical conduit, the flexible electrical conduit extending away from the first spring housing, wherein the flexible electrical conduit comprises a substantially planar flexible plastic substrate having a plurality of integrated conductive paths;
    electrical terminals disposed at a second end of the flexible electrical conduit, opposite the first end, the electrical terminals printed on a surface of the flexible electrical conduit, and the electrical terminals structured to be inserted into a receiving socket coupled to a test device; and
    a signal processing circuit mounted on the printed circuit board and coupled to the signal pad, the signal processing circuit configured to modify the electrical signal received from the electrical device when the signal lead is attached to the electrical device and pass the modified electrical signal to the test device when the flexible electrical conduit is coupled to the test device at a second end, opposite the first end, of the flexible electrical conduit.

2. The signal lead of claim 1, wherein the electrical terminals are structured to be inserted into a zero insertion force receiving socket.

3. The signal lead of claim 1, further comprising a protective tab covering at least a portion of the printed circuit board and configured to physically protect the covered portion of the printed circuit board.

4. The signal lead of claim 1, further comprising an identification device coupled to the printed circuit board and configured to electronically identify the particular signal lead to the test device when the flexible electrical conduit is coupled to the test device at a second end, opposite the first end, of the flexible electrical conduit.

5. The signal lead of claim 1, in which the first spring is a torsion spring.

6. The signal lead of claim 1, further comprising:
    a ground pad disposed on the printed circuit board; and
    a second spring electrically coupled to the ground pad and structured to touch the electrical device and carry a ground signal between the electrical device and the ground pad when the signal lead is attached to the electrical device.

7. A signal lead structured to be attached to an electrical device, the signal lead comprising:
- a signal pad;
- a second signal pad;
- a first spring housing, the first spring housing structured to touch the electrical device when the signal lead is attached to the electrical device;
- a printed circuit board coupled to the first spring housing, the signal pad and the second signal pad being disposed on the printed circuit board;
- a first spring carried in the first spring housing, the first spring being uncompressed and having a first end extending beyond a surface of the first spring housing when the signal lead is not attached to the electrical device, and the first spring being compressed and having the first end substantially even with the surface of the first spring housing when the signal lead is attached to the electrical device;
- a second spring carried in the first spring housing, the second spring being uncompressed and having a first end extending beyond a surface of the first spring housing when the signal lead is not attached to the electrical device, and the second spring being compressed and having the first end substantially even with the surface of the first spring housing when the signal lead is attached to the electrical device;
- a flexible electrical conduit coupled to the printed circuit board at a first end of the flexible electrical conduit, the flexible electrical conduit extending away from the first spring housing, wherein the flexible electrical conduit comprises a substantially planar flexible plastic substrate having a plurality of integrated conductive paths; and
- electrical terminals disposed at a second end of the flexible electrical conduit, opposite the first end, the electrical terminals printed on a surface of the flexible electrical conduit, and the electrical terminals structured to be inserted into a receiving socket coupled to a test device,
- wherein the first spring and the second spring are structured to align with a pair of lands on the electrical device when the signal lead is attached to the electrical device and to convey a differential electrical signal from the pair of lands to the signal pad and the second signal pad, and
- wherein a pair of conductive paths of the plurality of conductive paths is structured to convey the differential electrical signal from the signal pad and the second signal pad to the test device through a corresponding pair of electrical terminals on the flexible electrical and a corresponding pair of electrical terminals in the receiving socket.

8. The signal lead of claim 7, in which the first spring and the second spring are torsion springs.

9. The signal lead of claim 1, further comprising an attachment mechanism configured to securely attach the signal lead to the electrical device.

10. The signal lead of claim 9, in which the attachment mechanism is a clamp.

11. The signal lead of claim 9, in which the attachment mechanism is an adhesive foam.

12. The signal lead of claim 9, in which the attachment mechanism is an epoxy.

13. The signal lead of claim 1, in which the first spring housing comprises an electrically insulative plastic.

14. The signal lead of claim 7, wherein the electrical terminals are structured to be inserted into a zero insertion force receiving socket.

15. The signal lead of claim 7, further comprising:
- a signal processing circuit mounted on the printed circuit board and coupled to the signal pad and the second signal pad, the signal processing circuit configured to modify the differential electrical signal received from the electrical device when the signal lead is attached to the electrical device and pass the modified differential electrical signal to the test device when the flexible electrical conduit is coupled to the test device at a second end, opposite the first end, of the flexible electrical conduit.

16. The signal lead of claim 7, in which the first spring and the second spring are torsion springs.

17. The signal lead of claim 7, further comprising a protective tab covering at least a portion of the printed circuit board and configured to physically protect the covered portion of the printed circuit board.

18. The signal lead of claim 7, further comprising an identification device coupled to the printed circuit board and configured to electronically identify the particular signal lead to the test device when the flexible electrical conduit is coupled to the test device.

19. The signal lead of claim 7, further comprising:
- a pair of ground pads; and
- a third spring and a fourth spring electrically coupled to the pair of ground pads and structured to touch the electrical device and carry a ground signal between the electrical device and the pair of ground pads when the signal lead is attached to the electrical device.

20. The signal lead of claim 7, further comprising a removeable protective covering disposed over the first end of the first spring and the first end of the second spring when the signal lead is not attached to the electrical device.

* * * * *